US005808507A

United States Patent [19]

Melse et al.

[11] Patent Number: 5,808,507

[45] Date of Patent: Sep. 15, 1998

[54] TEMPERATURE COMPENSATED REFERENCE VOLTAGE SOURCE

[75] Inventors: Abraham L. Melse; Johan C. Halberstadt; Hendrikus J. Janssen, all of Nijmegen, Netherlands

[73] Assignee: U.S. Philips Corporation, New York, N.Y.

[21] Appl. No.: 808,592

[22] Filed: Feb. 28, 1997

[30] Foreign Application Priority Data

Feb. 28, 1996 [EP] European Pat. Off. .............. 96200517

[51] Int. Cl.[6] ........ H03H 3/04

[52] U.S. Cl. ........ 327/538; 327/540; 327/541; 327/543

[58] Field of Search ........ 327/538, 539, 327/540, 541, 542, 543

[56] References Cited

U.S. PATENT DOCUMENTS

| | | | |
|---|---|---|---|
| 3,979,610 | 9/1976 | Gordon | 307/297 |
| 4,309,627 | 1/1982 | Tabata | 307/362 |
| 5,038,053 | 8/1991 | Djenguerian et al. | 307/310 |
| 5,198,701 | 3/1993 | Davies et al. | 307/296.3 |
| 5,357,149 | 10/1994 | Kimura | 307/310 |

FOREIGN PATENT DOCUMENTS 9527938 10/1995 WIPO .

OTHER PUBLICATIONS

"A Precision Reference Voltage Source", Karel E. Kuijk, IEEE Journal of Solid State Circuits, vol., SC8, No.3, Jun. 1973.

*Primary Examiner*—Timothy P. Callahan
*Assistant Examiner*—An T. Luu
*Attorney, Agent, or Firm*—Bernard Franzblau

[57] ABSTRACT

A reference voltage source comprises a first current branch (16, 36) and a second current branch (30, 34, 12). The voltage on a first terminal (6) in the first current branch (16, 26) is one junction voltage higher than the voltage on a second terminal (8) in the second current branch (30, 34, 12) owing to the presence of a transistor (80). The ratio between the current $I_1$ through the first current branch (16, 36) and the current $I_2$ through the second current branch (30, 34, 12) is thus determined by two non-linear characteristics having opposite temperature coefficients. A reference voltage ($v_z$) with a small temperature coefficient and with a value which can be chosen freely can be generated by an appropriate choice of the resistance values for the resistors (58, 30, 16, 12) and by scaling the emitter areas of the transistors (34, 36, 70, 80).

17 Claims, 3 Drawing Sheets

TEMPERATURE COMPENSATED REFERENCE VOLTAGE SOURCE

BACKGROUND OF THE INVENTION

1. Field of the Invention

This invention relates to a reference voltage source comprising:

- a first common terminal, a second common terminal, a first connection terminal, a second connection terminal, and an output terminal;
- a first resistor and a first transistor having a base and having a collector-emitter path connected in series between the first connection terminal and the second common terminal;
- a second resistor connected between the first common terminal and the second connection terminal;
- a diode-connected second transistor having a collector-emitter path connected between the second connection terminal and the second common terminal and having a base coupled to the base of the first transistor;
- a third resistor connected between the first common terminal and the first connection terminal;
- a fourth resistor connected between the first common terminal and the output terminal;
- a third transistor having a base, emitter and collector, which are coupled to the first connection terminal, the second common terminal, and the output terminal, respectively.

2. Description of the Related Art

Such a reference voltage source is known from an International Application in series with the third resistor. The third transistor operates as a differential amplifier which makes the voltage difference between the first and the second connection terminal substantially zero. As a consequence, the second connection terminal may be regarded as the input terminal of a first current mirror which is formed by the first transistor, the second resistor and the second transistor, and whose output terminal is formed by the first connection terminal. The first current mirror has a current transfer with a positive temperature coefficient (TC) caused by the voltage difference between the base-emitter junctions of the first and the second transistor, which voltage difference appears across the first resistor. The configuration with the differential amplifier, the second resistor and the semiconductor junction imposes a given ratio between the currents through the first and the second transistor. This configuration operates as a second current mirror whose current transfer has a negative temperature coefficient (TC). The combination of the two current mirrors results in a multiplication of two opposite temperature coefficients, the sum of the currents in the first or the second common terminal having a TC whose sign and value can be adjusted by a suitable choice of the first and the second resistor and of the ratio between the current densities in the first and the second transistor. The sum of the currents also flows through the fourth resistor. Thus, it is possible to generate on the output terminal 26 a voltage with a TC of approximately zero over a given temperature range.

SUMMARY OF THE INVENTION

It is an object of the invention to provide a reference voltage source with an improved performance. To this end, the reference voltage source of the type defined in the opening paragraph is characterized in that the reference voltage source further comprises a fourth transistor having a base, emitter and collector, the third transistor having its base coupled to the emitter of the fourth transistor, the fourth transistor having its base connected to the first connection terminal, and the fourth transistor having its collector coupled to the output terminal.

The base-emitter junction of the fourth transistor performs the function of the semiconductor junction arranged in series with the third resistor in the known reference voltage source. This does not affect the basic operation of the configuration. The fourth transistor together with the third transistor forms a Darlington arrangement with a high current gain. The high current gain contributes to a lower output impedance of the reference voltage source. The reduced load of the first connection terminal leads to a more accurate result as regards the envisaged reference voltage and TC.

An embodiment of the reference voltage source is characterized in that the fourth transistor has its emitter coupled to the second common terminal via a current-carrying element. The current-carrying element can be a current source or a resistor, by means of which bias current is supplied to the fourth transistor. As a result of this, the effect of the spread in the base current of the fourth transistor is comparatively smaller and the accuracy is improved.

A further embodiment of the reference voltage source is characterized in that the current-carrying element comprises a fifth transistor having a collector-emitter path connected between the emitter of the fourth transistor and the second common terminal, and having a base connected to the base of the second transistor. The fifth transistor operates as a current source with a current whose intensity is related to the currents through the second transistor. As a consequence, the base current of the fourth transistor is related to the sum of the base currents of the first and the second transistor, which results in an even further reduction of the spread in the generated reference voltage.

BRIEF DESCRIPTION OF THE DRAWINGS

These and other aspects of the invention will now be described and elucidated with reference to accompanying drawings, in which.

In these Figures elements having like functions or purposes bear the same reference symbols.

DETAILED DESCRIPTION OF THE PREFERRED EMBODIMENT

Figure 1:
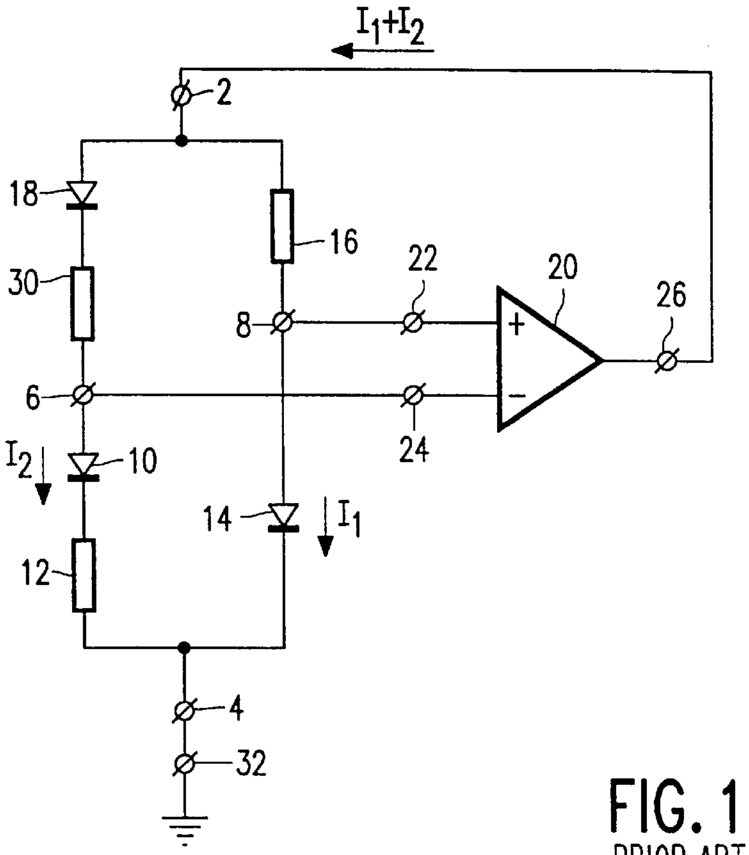
FIG. 1 PRIOR ART
FIG. 1 a basic diagram of a prior-art reference voltage source.

FIG. 1 shows the general circuit diagram of a prior-art reference voltage source on which the invention is based. There are provided a first common terminal 2, a second common terminal 4, a first connection terminal 6 and a second connection terminal 8. A first semiconductor junction 10 and a first resistor 12 are connected in series between the first connection terminal 6 and the second common terminal 4. A second semiconductor junction 14 is connected between the second connection terminal 8 and the second common terminal 4. A second resistor 16 is connected between the second connection terminal 8 and the first common terminal 2. A third semiconductor junction 18 in series with a third resistor 30 is connected between the first connection terminal 6 and the first common terminal 2. Moreover, there is provided a differential amplifier 20 having a non-inverting input 22 and an inverting input 24, one of these inputs being coupled to the first connection terminal 6 and the other input being coupled to the second connection terminal 8, and having an output 26 coupled to the first common terminal 2. The second common terminal 4 is connected to a first supply terminal 32, which is grounded. A first current $I_1$ flows from the first common terminal 2 to the second common terminal 4 via the second connection terminal 8. A second current I2 flows from the first common terminal 2 to the second common terminal 4 via the first connection terminal 6. The sum current $I_1+I_2$ is supplied to the first common terminal 2 by the output 26 of the differential amplifier 20 and flows to the first supply terminal 32 via the second common terminal 4. The input current to the non-inverting input 22 and the inverting input 24 may be ignored. The differential amplifier 20 makes the voltage difference between the first connection terminal 6 and the second connection terminal 8 very small.

For the following observation it is assumed that the value of the third resistor 30 is zero ohms. The voltage across the second resistor 16 is then equal to the junction voltage $Vbe_3$ across the third semiconductor junction 18. The current $I_1$ through the second resistor 16 consequently complies with the equation:

$$I_1 = \frac{Vbe_3}{R_2} \qquad (1)$$

Here, $R_2$ is the resistance value of the second resistor 16. The current $I_2$ complies with the following equation:

$$I_2 = \frac{V_T}{R_1} \ln\left[\frac{I_1}{I_2} \cdot \frac{A_1}{A_2}\right] \qquad (2)$$

Here, $V_T$ is the thermal potential (kT/q), $R_1$ is the resistance value of the first resistor 12, $A_1$ is the area of the first semiconductor junction 10 and $A_2$ is the area of the second semiconductor junction 14. Equation (2) is known per se. For further details reference is made to, for example, IEEE Journal of Solid States Circuits, Vol. SC-8, No. 3, June 1973, pp. 222–226, "A Precision Reference Voltage Source".

Equation (1) may be regarded to express the effect of a first current mirror having a current transfer with a negative temperature coefficient (TC), since the junction voltage $Vbe_3$, as is known, has a negative TC. Equation (2) represents the operation of a second current mirror having a positive TC. Since $V_T$=kT/q is proportional to the absolute temperature T, the ratio $I_2/I_1$ has a positive TC. If the temperature T now increases, the junction voltage $Vbe_3$ and hence the first current $I_1$ will decrease. However, the decrease of the first current $I_1$, is compensated by an increase in the second current $I_2$ owing to the positive TC in the ratio $I_2/I_1$. Thus, the sum current $I_1+I_2$ can have a TC which is positive, or negative, or substantially zero. By arranging a third resistor 30 in series with the third semiconductor junction 18 it is possible to reduce the comparatively large negative TC of the first current mirror. The second current $I_2$ with a positive TC flows through the third resistor 30 and produces across the third resistor 30 a voltage drop which also has a positive TC. The positive TC of this voltage drop reduces the negative TC of the junction voltage $Vbe_3$. The third semiconductor junction 18 provides an additional degree of freedom, which can be used to realize a reference voltage source having a TC which can be chosen freely, within certain limits, and with a nominal voltage which can be chosen freely.

Figure 2:
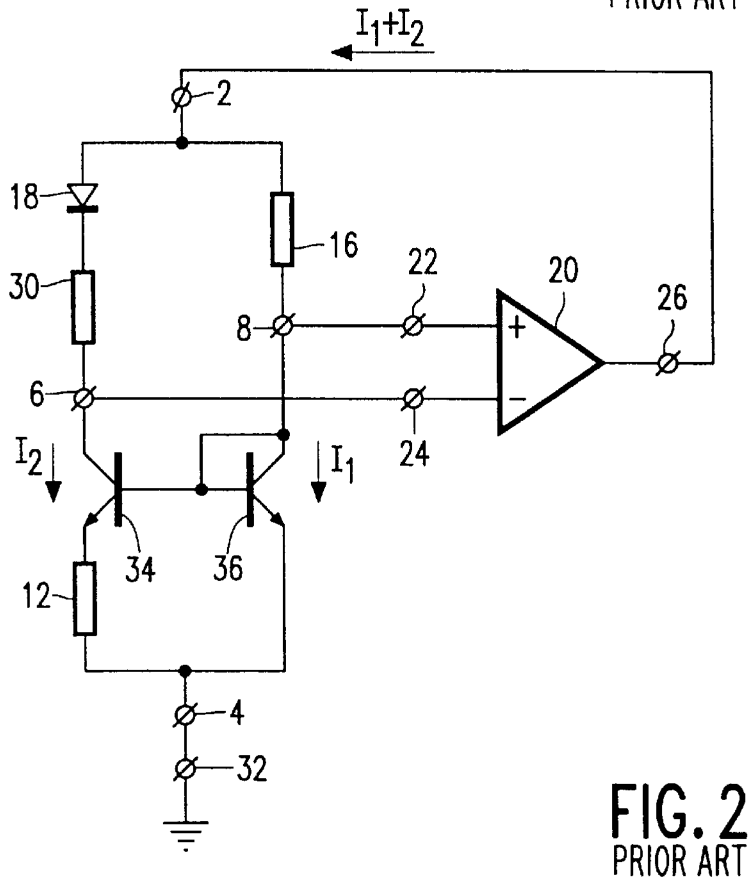
FIG. 2 PRIOR ART
FIG. 2 shows a basic diagram of a prior-art reference voltage source.

The first semiconductor junction 10, the second semiconductor junction 14 and the third semiconductor junction 18 are shown as diodes but they may also be formed by transistors each having an interconnected collector and base. The effect of the first semiconductor junction 10, the first resistor 12 and the second semiconductor junction 14 can also be obtained in an alternative manner. FIG. 2 shows such an alternative for the arrangement of FIG. 1. In FIG. 2 the first semiconductor junction 10 is the base-emitter junction of a first transistor 34 whose collector is coupled to the first connection terminal 6 and whose emitter is connected to the first resistor 12; the second semiconductor junction 14 is the base-emitter junction of a diode-connected second transistor 36 whose base is connected to the base of the first transistor 34 and whose collector is coupled to the second connection terminal 8.

Figure 3:
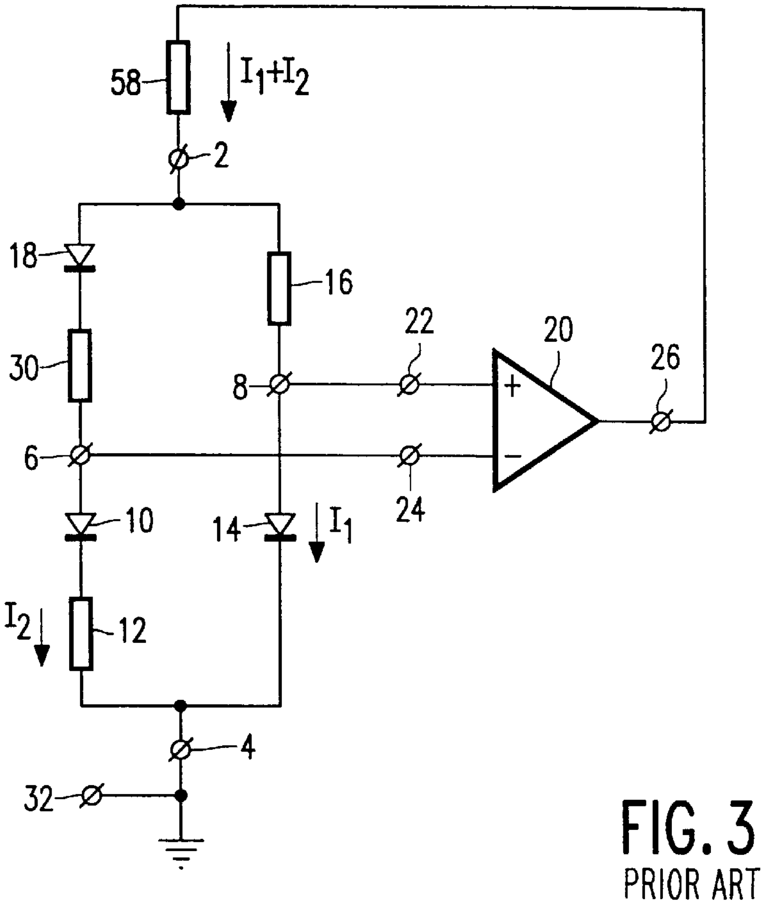
FIG. 3 PRIOR ART
FIG. 3 shows a prior-art reference voltage source.

If it is required to obtain a sum current $I_1+I_2$ with a TC which is substantially zero, a decrease of the first current $I_1$ compensates for an increase of the second current $1_2$ owing to the positive TC in the ratio $I_2/I_1$. Thus, the sum current $I_{+I2}$ can be given a TC which is substantially zero. However, it is also possible to aim deliberately at less than full compensation, in which case the sum current will have a TC which is positive. FIG. 3 shows a circuit arrangement where this is the case. The circuit arrangement is based on a variant of FIG. 1 but the variants shown in FIG. 2 is equally suitable. The output 26 of the differential amplifier 20 is now connected to the first common terminal 2 via a fourth resistor 58. Starting from the first supply terminal 32, the voltage on the output 26 is now found to be equal to the sum of the junction voltage $Vbe_{14}$ of the second semiconductor junction 14, the voltage drop $Ur_{30}$ across the third resistor 30, the junction voltage $Vbe_{18}$ of the third semiconductor junction 18 and the voltage drop $Ur_{58}$ across the fourth resistor 58. The current $I_2$, which as already stated has a positive TC, flows through the third resistor 30. The sum current $I_{+I2}$, which also has a positive TC, flows through the fourth resistor 58. The sum voltage across the third resistor 30 and the fourth resistor 58 can thus have a positive TC, which compensates for the negative TC of the two semiconductor junctions. Thus, a voltage is available on the output 26 with a TC which is substantially zero and with a magnitude which can be determined by the choice of the resistors 12, 16, 30 and 58.

Figure 4:
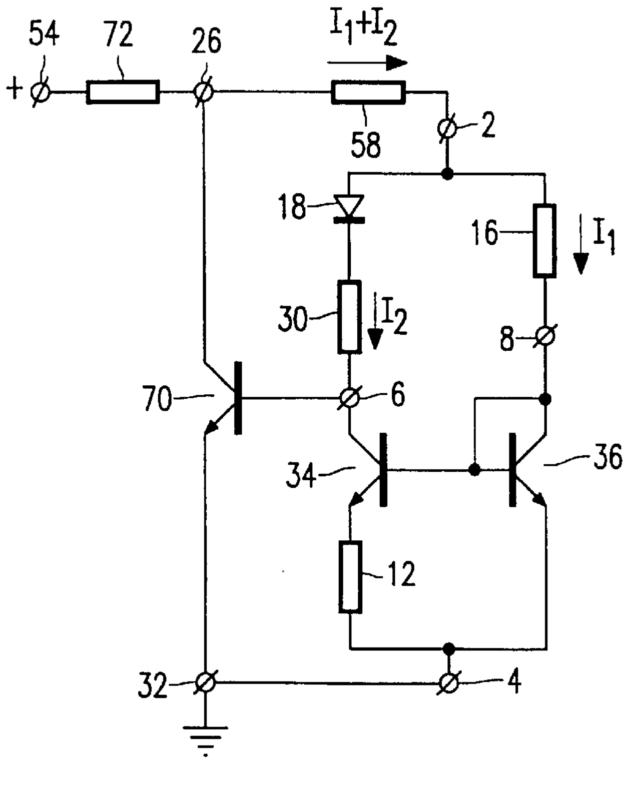
FIG. 4 PRIOR ART
FIG. 4 shows a prior-art reference voltage source.

The differential amplifier 20 in FIG. 3 can be simplified considerably when it is based on the variant shown in FIG. 2. The result is shown in FIG. 4. The differential amplifier 20 now comprises a third transistor 70, whose emitter, base and collector are connected to the first supply terminal 32, the first connection terminal 6 and the non-inverting output 26, respectively. The output 26 is connected to a second supply terminal 54 via a fifth resistor 72. However, instead of a fifth resistor it is also possible to use a current source. The base of the third transistor 70 functions as the inverting input. The emitter of the third transistor 70 functions as the non-inverting input, which is coupled to the second connection terminal 8 via the base-emitter junction of the second transistor 36 in order to compensate for the base-emitter offset voltage of the third transistor 70.

Figure 5:
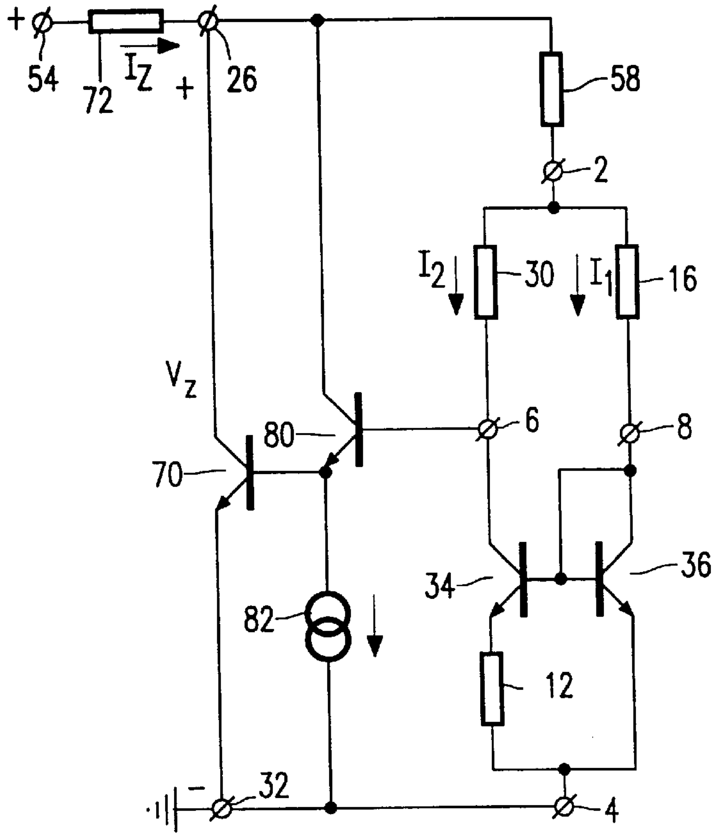
FIG. 5 shows an embodiment of a reference voltage source in accordance with the invention.

FIG. 5 shows a reference voltage source in accordance with the invention. The function of the semiconductor junction 18 is now performed by the base-emitter junction of a fourth transistor 80 having its base connected to the first connection terminal 6, having its emitter connected to the base of the third transistor 70, and having its collector connected to the output 26. The semiconductor junction 18 is dispensed with and the third resistor 30 is connected directly between the first connection terminal 6 and the first common terminal 2. As a result of this measure, the voltage difference between the base of the third transistor 70 and the first common terminal 2 remains the same. The voltage on the emitter of the fourth transistor 80 is equal to the voltage on the second connection terminal 8. Therefore, the above analysis based on two non-linear current mirrors remains valid. The third transistor 70 and the fourth transistor 80 together form a Darlington transistor having a high current gain. As a result, the load on the first connection terminal 6 is reduced substantially, so that the accuracy of the generated reference voltage increases. Moreover, owing to the higher current gain the output impedance on the output terminal 26 is reduced, as a result of which the reference voltage $V_Z$ is less dependent on variations in the current $I_Z$ which flows in the output 26. These qualities make the reference voltage source very suitable for use as an electronic zener diode, in which case the output 26 and the first supply terminal 32 should be regarded as the connection terminals of the zener diode. The reference voltage $V_z$ can be chosen freely by a suitable choice of the resistances. The lower limit is approximately 2.7 V, in which case the value of the fourth resistor 58 may approximate to zero. The upper limit is dictated by the maximum permissible collector-emitter voltage of the third transistor 70.

Figure 6:
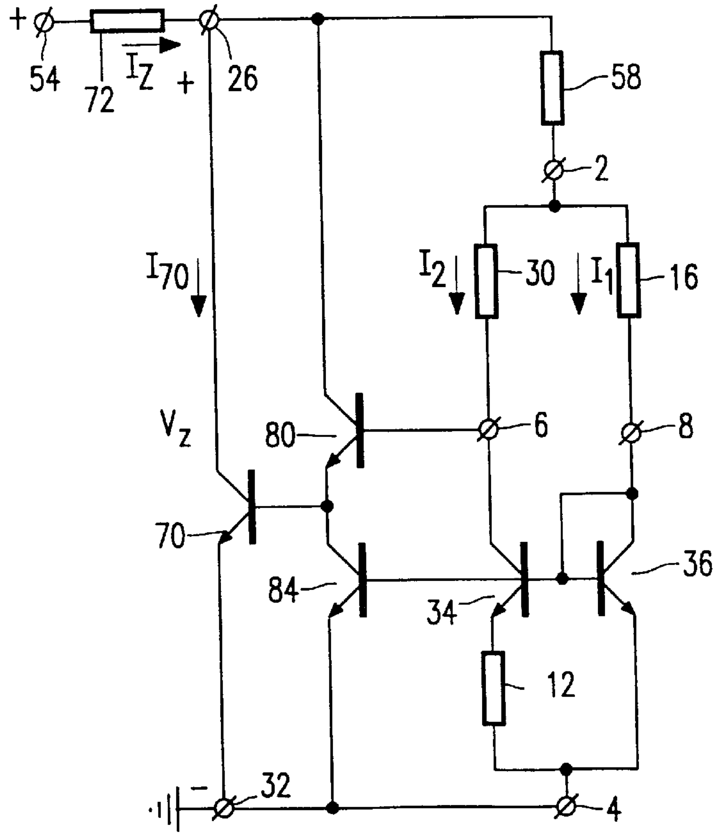
FIG. 6 shows an embodiment of a reference voltage source in accordance with the invention.

If desired, the quiescent current of the fourth transistor 80 can be fixed by means of an optional current source 82 connected between the emitter of the fourth transistor 80 and the first supply terminal 32. It is to be noted that for this purpose a resistor can be used instead of a current source. FIG. 6 shows an embodiment in which the current source comprises a fifth transistor 84, having its base, emitter and collector respectively connected to the base of the second transistor 36, the first supply terminal 32 and the emitter of the fourth transistor 80. This results in a well-defined bias current through the fourth transistor 80.

The following values are merely for guidance and provide an indication of the components to be used in the design of the reference voltage source. A similar result can be achieved with comparatively smaller resistance values and a correspondingly higher current level in the relevant current branches.

$V_z$=10 V; $I_1$=7 μA; $I_2$=7 μA; $T_{ref}$=50° C.; $I_z$=218 μA; $R_{58}$=577 KΩ; $R_{16}$=183 KΩ; $R_{30}$=100 KΩ; $R_{12}$=5.5 KΩ; $I_{70}$=196 μA; the emitter areas of the transistors 36, 70, 80 and 84 are equal to one another and the emitter area of the transistor 34 is four times as large as that of the transistor 36.

In that case the TC is approximately zero at the reference temperature $T_{ref}$. It is obvious that the reference temperature at which the TC is approximately zero can be given another value, for example 27° C.

We claim:

1. A reference voltage source comprising:

a first common terminal, a second common terminal, a first connection terminal, a second connection terminal, and an output terminal;

a first resistor and a first transistor having a base and having a collector-emitter path connected in series between the first connection terminal and the second common terminal;

a second resistor connected between the first common terminal and the second connection terminal;

a diode-connected second transistor having a collector-emitter path connected between the second connection terminal and the second common terminal and having a base coupled to the base of the first transistor;

a third resistor connected between the first common terminal and the first connection terminal;

a fourth resistor connected between the first common terminal and the output terminal;

a third transistor having a base, emitter and collector, which are coupled to the first connection terminal, the second common terminal, and the output terminal, respectively, a fourth transistor having a base, emitter and collector, the third transistor having its base coupled to the emitter of the fourth transistor, the fourth transistor having its base connected to the first connection terminal, and the fourth transistor having its collector coupled to the output terminal.

2. A reference voltage source as claimed in claim 1, characterized in that the fourth transistor has its emitter coupled to the second common terminal via a current source.

3. A reference voltage source as claimed in claim 1, which comprises a fifth transistor having a collector-emitter path connected between the emitter of the fourth transistor and the second common terminal, and having a base connected to the base of the second transistor.

4. The reference voltage source as claimed in claim 1 wherein the collector of the third transistor is directly connected to the output terminal and the first and fourth transistors are of the same polarity.

5. The reference voltage source as claimed in claim 1 wherein the first output terminal is connected to a terminal of a source of supply voltage via a further resistor.

6. The reference voltage source as claimed in claim 1 wherein the collector of the third transistor is connected to the output terminal via a bidirectional current path and the third and fourth transistors are of the same polarity.

7. The reference voltage source as claimed in claim 1 wherein the collector of the fourth transistor is connected to the output terminal via a bidirectional current path exclusive of the first connection terminal.

8. A reference voltage circuit comprising:

first and second common terminals, first and second connection terminals, and an output terminal, first, second, third and fourth resistors, a first transistor, a second diode-connected transistor, a third transistor and a fourth transistor, first means connecting the third resistor, the first connection terminal, the first transistor and the first resistor in a first series circuit between the first and second common terminals, second means connecting the second resistor, the second connection terminal, and the second diode-connected transistor in a second series circuit between the first and second common terminals and with a control electrode of the first transistor connected to a control electrode of the second transistor, third means connecting the third and fourth transistors as a Darlington pair between the output terminal and the second common terminal and with a control electrode of the fourth transistor connected to the first connection terminal, and fourth means connecting the fourth resistor between the first common terminal and the output terminal.

9. The reference voltage circuit as claimed in claim 8 wherein at least the first, second and fourth transistors are of the same polarity.

10. The reference voltage circuit as claimed in claim 8 wherein the first output terminal is connected to a terminal of a source of supply voltage for the circuit via a further resistor.

11. The reference voltage circuit as claimed in claim 8 wherein the collector of the third transistor is connected to the output terminal via a bidirectional current path.

12. The reference voltage circuit as claimed in claim 8 further comprising a fifth transistor connected in series circuit with the fourth transistor and having a control electrode connected to the control electrode of the second transistor.

13. The reference voltage circuit as claimed in claim 8 wherein first and second currents flow through the first and second series circuits, respectively, having opposite temperature coefficients, and the resistance value of one or more of the first, second, third and fourth resistors are chosen so that a reference voltage is produced at the output terminal having a small temperature coefficient.

14. The reference voltage source as claimed in claim 1 wherein the fourth transistor is connected across the collector/base junction of the third transistor.

15. The reference voltage source as claimed in claim 1 wherein first and second currents flow through the first and second transistors, respectively, having opposite temperature coefficients, and the resistance values of one or more of the first, second, third and fourth resistors are chosen so that a reference voltage is produced at the output terminal having a zero temperature coefficient.

16. The reference voltage source as claimed in claim 1 wherein at least the first, second and fourth transistors are of the same polarity.

17. The reference voltage circuit as claimed in claim 8 wherein the first common terminal is connected to one main electrode of the fourth transistor via the fourth resistor.

* * * * *